United States Patent [19]

Gaw et al.

[11] Patent Number: 5,270,245
[45] Date of Patent: Dec. 14, 1993

[54] METHOD OF FORMING A LIGHT EMITTING DIODE

[75] Inventors: Craig A. Gaw, Scottsdale; Chan-Long Shieh, Paradise Valley, both of Ariz.

[73] Assignee: Motorola, Inc., Schaumburg, Ill.

[21] Appl. No.: 982,525

[22] Filed: Nov. 27, 1992

[51] Int. Cl.⁵ .................. H01L 21/20; H01L 21/203
[52] U.S. Cl. .................. 437/127; 437/129; 437/984; 437/184; 257/600
[58] Field of Search ............ 437/127, 129, 23, 133, 437/984; 148/DIG. 141

[56] References Cited

U.S. PATENT DOCUMENTS

| | | | |
|---|---|---|---|
| 4,662,988 | 5/1987 | Renner | 437/129 |
| 4,969,712 | 11/1990 | Westwood et al. | 437/23 |
| 5,021,361 | 6/1991 | Kimoshita et al. | 437/133 |
| 5,064,772 | 11/1991 | Jambotkar | 437/984 |

FOREIGN PATENT DOCUMENTS

| | | | |
|---|---|---|---|
| 0422941 | 4/1991 | European Pat. Off. | 437/129 |
| 0134889 | 8/1984 | Japan | 437/127 |
| 0202964 | 8/1988 | Japan | 437/984 |
| 4037183 | 2/1992 | Japan | 437/129 |
| 2145558 | 3/1985 | United Kingdom | 148/DIG. 141 |

*Primary Examiner*—Olik Chaudhuri
*Assistant Examiner*—Ramamohan Rao Paladugu
*Attorney, Agent, or Firm*—Joe E. Barbee; Robert F. Hightower

[57] ABSTRACT

A method of forming a III-V semiconductor device (10, 20) utilizes a III-V semiconductor substrate (11) having a plurality of III-V semiconductor layers (12, 14, 15, 16, 17). A pattern layer (19, 24) is formed on the plurality of layers (12, 14, 15, 16, 17). The plurality of III-V semiconductor layers (12, 14, 15, 16, 17) is etched with an isotropic etch that does not etch the pattern layer (19, 24). The isotropic etch undercuts the pattern layer (19, 24) and exposes an area for forming ohmic contacts on the plurality of III-V semiconductor layers. The pattern layer (19, 24) is used as a mask while depositing ohmic contact material (22, 23, 28) onto the area for forming ohmic contacts.

14 Claims, 2 Drawing Sheets

METHOD OF FORMING A LIGHT EMITTING DIODE

This application is related to U.S. Pat. application Ser. No. 07/864,101 filed on Apr. 6, 1992 by Craig Gaw et al.

BACKGROUND OF THE INVENTION

The present invention relates, in general, to semiconductor devices, and more particularly, to III-V semiconductor devices.

In the past, the semiconductor industry has utilized a variety of methods to form self-aligned ohmic contacts on III-V semiconductor devices. These previous methods generally require multiple etching operations and accurately controlled diffusions in order to form such contacts. The accurately controlled diffusions require precise positioning of dopants within the device's structure. Since controlling dopant positioning is difficult, the device's contacts often are shorted together or improperly aligned thereby degrading or destroying the device's operation.

The multiple etching operations are time consuming and increase the device's cost.

Accordingly, it is desirable to have a method of forming III-V semiconductor devices that does not require accurately controlled positioning of dopants, and that minimizes the number of etching operations to form self-aligned ohmic contacts.

SUMMARY OF THE INVENTION

Briefly stated, the present invention includes a method of forming a III-V semiconductor device. The method utilizes a III-V semiconductor substrate having a plurality of III-V semiconductor layers. A pattern layer is formed on the plurality of layers. The plurality of III-V semiconductor layers is etched with an isotropic etch that does not etch the pattern layer. The isotropic etch undercuts the pattern layer and exposes an area for forming ohmic contacts on the plurality of III-V semiconductor layers. The pattern layer is used a mask while depositing ohmic contact material onto the area for forming ohmic contacts.

DETAILED DESCRIPTION OF THE DRAWINGS

Figure 1:
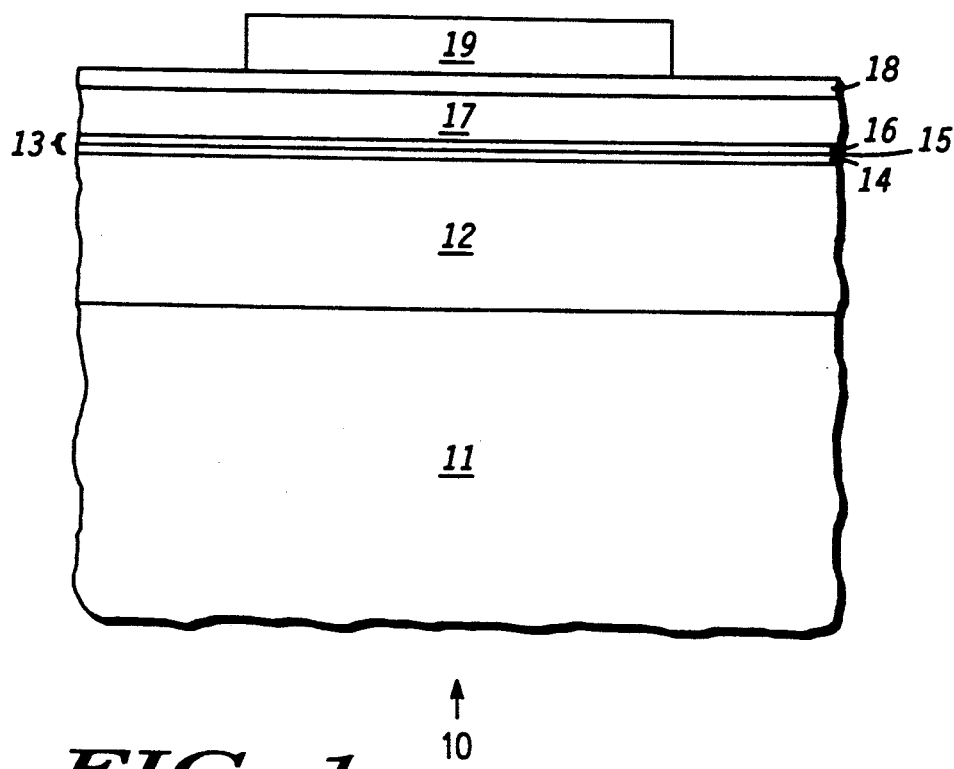
FIG. 1 illustrates an enlarged cross-sectional portion of an LED during manufacture in accordance with the present invention.

FIG. 1 illustrates a cross-sectional portion of a III-V light emitting diode (LED) 10 at a stage of manufacturing. LED 10 includes an N-type gallium arsenide (GaAs) substrate 11 having an N-type aluminum gallium arsenide (AlGaAs) cladding layer 12 on a first surface of substrate 11. In the preferred embodiment, substrate 11 is heavily doped in order to provide a low resistance current path that lowers the series resistance of LED 10, and provides uniform illumination across LED 10. Also in this preferred embodiment, layer 12 typically is moderately doped, has a thickness of approximately 1.0 to 4.5 microns, and has an aluminum arsenide molar fraction of approximately twenty to fifty percent ($Al_{0.2-0.5}Ga_{0.8-0.5}As$). An undoped active region 13 is on a surface of layer 12, and forms a quantum well that emits light at a wavelength which easily travels through substrate 11 and layer 12. Active region 13 can have a variety of configurations that form such a quantum well including a separate confinement heterostructure (SCH), graded index separate confinement heterostructure (GRINSCH), or a single layer having a very small band gap such as indium gallium arsenide (InGaAs).

In the preferred embodiment, active region 13 is a separate confinement heterostructure (SCH) that includes an undoped indium gallium arsenide (InGaAs) layer 15 that is sandwiched between first and second undoped gallium arsenide layers 14 and 16 respectively. This structure provides LED 10 with high electroluminescence efficiency. Light emitted from region 13 has a wavelength of approximately 920 to 1,200 nanometers to efficiently transit layers 11 and 12. Layer 15 has a thickness between approximately five and twenty nanometers to form a thin quantum well that provides high carrier confinement to further increase electroluminescence efficiency.

A P-type AlGaAs confinement layer 17 is epitaxially formed on active region 13 in order to provide an energy barrier that assists in confining carriers to active region 13. Layer 17 generally has an aluminum arsenide molar fraction between approximately ten and ninety-five percent to facilitate such confinement. In the preferred embodiment, the aluminum arsenide molar fraction is between thirty-five and fifty percent to create a large band gap that maximizes carrier confinement.

A heavily doped P-type gallium arsenide contact layer 18 on a surface of confinement layer 17 will subsequently be utilized to form low resistance ohmic contact to layer 17. In the preferred embodiment, contact layer 18 is approximately 100 to 300 nanometers thick. A pattern layer 19 is applied to layer 18, and then patterned to cover a portion of layer 18 and expose sections of layer 18 along opposite sides of layer 19. The material used for layer 19 forms a low resistance ohmic contact to layer 18, thus, the portion of region 13 underlying layer 19 becomes the light emission region of LED 10. Although various materials can create the necessary ohmic contact, in the preferred embodiment, layer 19 is a multi-layer metal system formed by applying a layer of titanium, followed by a layer of platinum, and finally a layer of gold.

Active region 13, and layers 12, 17, and 18 are epitaxially formed using techniques such as metal organic chemical vapor deposition (MOCVD) or molecular beam epitaxy (MBE) that are well known to those skilled in the semiconductor art.

Figure 2:
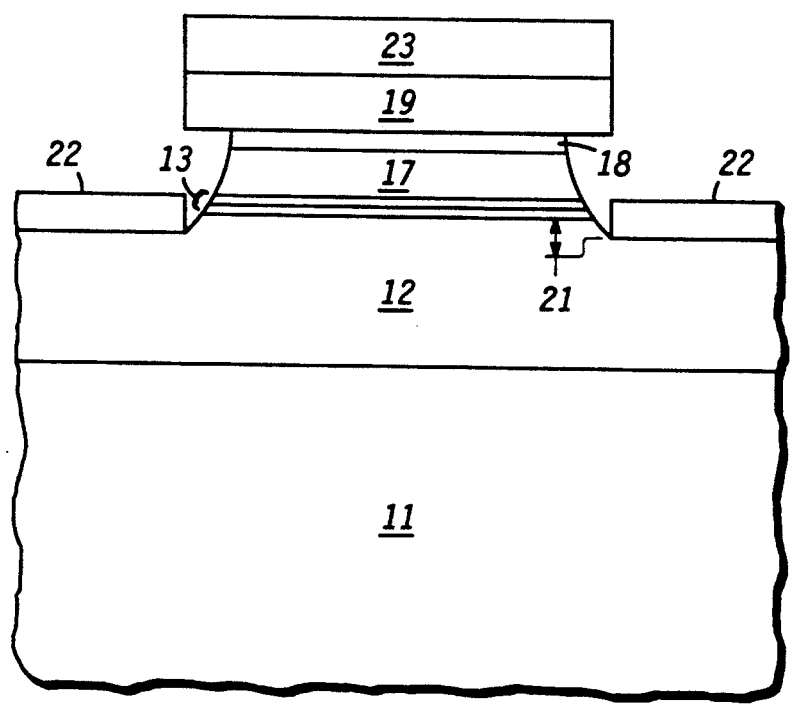
FIG. 2 illustrates the LED of FIG. 1 after applying ohmic contacts in accordance with the present invention.

FIG. 2 illustrates a subsequent stage in forming LED 10 of FIG. 1. Elements of FIG. 2 that are the same as FIG. 1 have the same reference numerals. After layer 19 is patterned, a single isotropic etch is utilized to remove exposed portions of layer 18, underlying portions of layer 17, and underlying portions of region 13 without etching layer 19. A variety of etch methods such as plasma etching, reactive ion etchings, or a wet etch employing a solution of acid, peroxide, and water provide such a selective isotropic etch. In the preferred embodiment, a solution that includes hydrochloric acid, hydrogen peroxide, and water is used to etch LED 10 for approximately five to fifteen minutes. As the isotropic etching is continued, underlying portions of layer 12 are etched until reaching a first distance 21 into layer 12. The isotropic etch also removes portions of the sidewalls of layer 12, region 13, and layers 17 and 18 thereby undercutting pattern layer 19. Since an isotropic etch is used, sidewall material is removed at the same rate material is removed from the horizontal surfaces. Consequently, etching distance 21 into layer 12 ensures that layer 19 overhangs or extends past the intersection of layer 12 and region 13 by at least distance 21. Thus, a portion of layer 12 is formed into a first mesa projecting a distance 21 above the surface of layer 12. Subsequently, the surface will be used for forming a plurality of ohmic contacts 22. The first mesa's width is larger than the width of region 13, and smaller than the width of either substrate 11 or pattern layer 19.

Subsequently, layer 19 is used as a mask to deposit ohmic contact material onto cladding layer 12 and pattern layer 19. Due to the layer 19 overhang, the deposition creates a pair of first electrodes or N-type ohmic contacts 22 that are electrically isolated from a second electrode or P-type contact 23. The materials used for contacts 22 and 23 include both metals and doped semiconductor materials. In the preferred embodiment, contacts 22 and 23 are formed by sequentially depositing layers of nickel, germanium, and gold.

Figure 3:
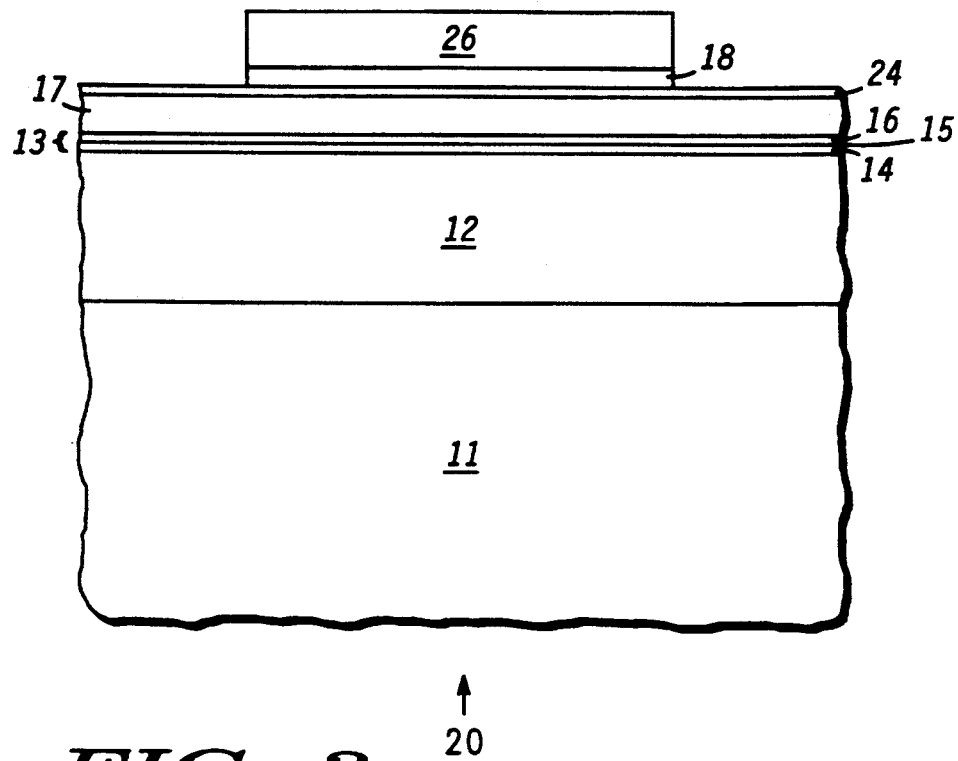
FIG. 3 illustrates an enlarged cross-sectional portion of an alternate embodiment of an LED during manufacture in accordance with the present invention.
Figure 4:
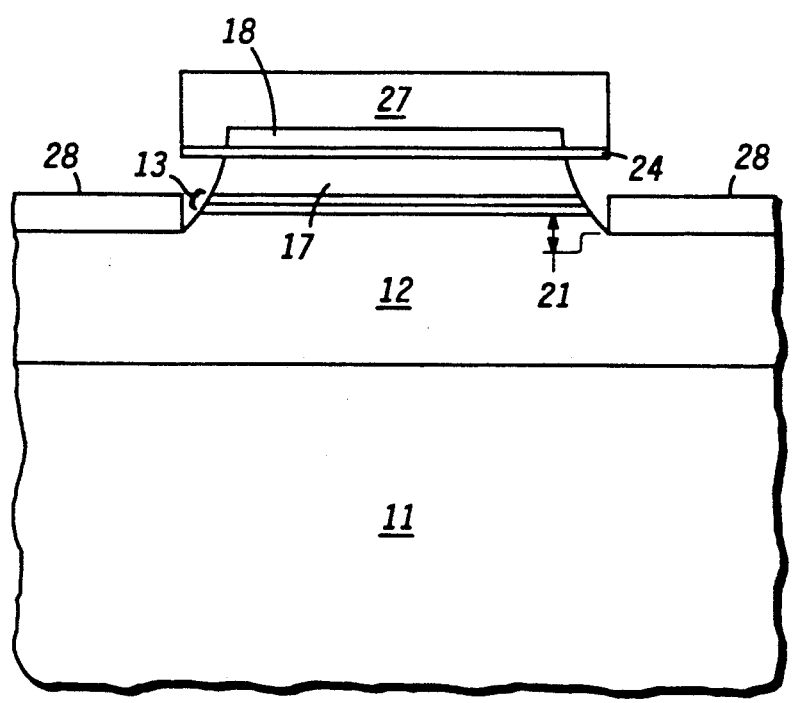
FIG. 4 illustrates the LED of FIG. 3 after applying ohmic contacts in accordance with the present invention.

FIG. 3 and FIG. 4 illustrate an enlarged cross-sectional portion of an LED 20 that is an alternate embodiment to LED 10 shown in FIG. 1 and FIG. 2. Elements of FIG. 3 that are the same as elements of FIG. 1 and FIG. 2 have the same reference numerals. LED 20 includes a P-type indium gallium phosphide (InGaP) pattern layer 24 covering layer 17. As will be seen hereinafter, the material of layer 24 is chosen to provide etching characteristics which facilitate forming an overhang that is usable as a mask for applying ohmic contacts.

Contact layer 18 is formed to cover layer 24. At the stage of manufacturing shown in FIG. 3, a photoresist mask 26 is patterned to cover a portion of layer 18. Then, the exposed portions of layer 18 are removed by isotropically etching layer 18 with an etchant that is devoid of hydrochloric acid (HCl). Suitable non-HCl etchants include a solution of sulfuric acid, peroxide, and water, and also a solution of phosphoric acid, peroxide, and water. Such non-HCl etchants react with layer 18 but do not affect layer 24. Consequently, layer 24 functions as an etch stop that terminates etching after removing the exposed portions of layer 18. After removing the portions of layer 18, portions of layer 24 are exposed.

Referring to FIG. 4, the exposed portions of layer 24, shown in FIG. 3, are removed by utilizing an etching solution including hydrochloric acid (HCl) and water. The solution reacts with the InGaP of layer 24 but does not affect the AlGaAs of layer 17. Thus, layer 17 functions as an etch stop during the removal of the exposed portions of layer 24. Then, a non-HCl isotropic etch is utilized to remove exposed portions of layers 17, 16, 15, 14, and to etch a distance 21 into layer 12. The function of distance 21 is described hereinbefore in the explanation of FIG. 2. The isotropic etching undercuts layer 24 and leaves the distal edges of layer 24 protruding from a second mesa formed by layers 12, 13, 17, and 18. Also, the exposed sidewalls of layer 18 are etched thereby undercutting mask 26 (shown in FIG. 3).

After removing mask 26, the protruding portion of layer 24 is utilized as a mask while depositing ohmic contact material to form N-type ohmic contacts 28. Concurrently, the ohmic contact material also forms a P-type ohmic contact 27 covering contact layer 18 and a portion of layer 24. In the preferred embodiment, a nickel germanium gold alloy is used for the ohmic contact material since such alloys form a low resistance ohmic contact to both N-type and heavily doped P-type GaAs.

Although LEDs 10 and 20 have been described having an undoped active region, it is intended that the description also apply to an LED employing either a P-type or an N-type active region, and to other types of semiconductor structures.

By now it should be appreciated that there has been provided a novel method of forming a III-V semiconductor device. No critical mask alignments are utilized in the method of forming the device. By using an isotropic etch that does not affect the pattern layer, the number of etching operations required to form self-aligned contacts on LED 10 are minimized. Undercutting the pattern layer ensures that the pattern layer can be used as a mask that will eliminate shorts between the device's electrodes. Minimizing the etching operations reduces the device's cost. Since no critical diffusion operations are utilized, the device's yields are improved thereby further lowering the device's cost.

We claim:

1. A method of forming a light emitting diode comprising:
    providing a gallium arsenide substrate having a first conductivity type;
    covering the substrate with an epitaxial aluminum gallium arsenide cladding layer having the first conductivity type;
    forming an active layer on the cladding layer wherein the active layer is undoped and forms a quantum well that emits light;
    covering the active layer with an aluminum gallium arsenide confinement layer having a second conductivity type;
    forming a gallium arsenide contact layer on the confinement layer wherein the gallium arsenide contact layer has the second conductivity type;
    covering a portion of the contact layer with a pattern layer wherein a first portion of the contact layer is exposed along a first side of the pattern layer and a second portion of the contact layer is exposed along an opposite side of the pattern layer;
    removing the first portion and the second portion of the contact layer, underlying portions of the confinement layer, underlying portions of the active layer, and underlying portions of the cladding layer until reaching a first distance into the cladding layer thereby creating an exposed portion of the cladding layer by using a single isotropic etching operation for undercutting the pattern layer and forming an overhang wherein the isotropic etching does not etch the pattern layer; and
    using the pattern layer as a mask while depositing ohmic contact material onto the pattern layer and onto the exposed portion of the cladding layer wherein a plurality of self-aligned contacts are formed on the exposed portion of the cladding layer.

2. The method of claim 1 wherein forming the active layer on the cladding layer includes forming a separate confinement heterostructure comprising a first gallium arsenide layer, a layer of indium gallium arsenide on the first gallium arsenide layer, and a second gallium arsenide layer on the indium gallium arsenide.

3. The method of claim 1 wherein forming the active layer on the cladding layer wherein the active layer is undoped and forms the quantum well that emits light includes forming the quantum well to emit light at a wavelength of approximately 920 to 1200 nanometers.

4. The method of claim 1 wherein the removing the first portion and the second portion of the contact layer step includes using a solution of hydrochloric acid, hydrogen peroxide, and water for removing the first portion and the second portion of the contact layer.

5. The method of claim 1 wherein covering the portion of the contact layer with the pattern layer includes covering the portion of the contact layer with a metal that forms an ohmic contact on the contact layer.

6. The method of claim 5 wherein covering the portion of the contact layer with the metal includes covering the portion of the contact layer with a layer of titanium followed by a layer of platinum followed by a layer of gold.

7. The method of claim 1 wherein using the pattern layer as a mask while depositing ohmic contact material includes depositing a layer of nickel followed by a layer of germanium followed by a layer of gold.

8. A method of forming a light emitting diode comprising:
   providing a III-V semiconductor substrate having a plurality of III-V semiconductor layers on the substrate wherein a top layer of the plurality of layers is distal from the substrate;
   forming a pattern layer on the top layer wherein a portion of the top layer is exposed adjacent the pattern layer;
   removing exposed portions of the top layer and portions of an underlying layer until reaching a first distance into the underlying layer by using a single isotropic etch that undercuts the pattern layer but does not etch the pattern layer thereby exposing an area for forming ohmic contact on the underlying layer; and
   using the pattern layer as a mask while depositing ohmic contact material onto the area for forming ohmic contact and onto the pattern layer.

9. The method of claim 8 wherein providing the III-V semiconductor substrate having the plurality of III-V semiconductor layers on the substrate includes having a cladding layer on the substrate, a separate confinement heterostructure that forms an active layer on the cladding layer, a confinement layer on the active layer, and a contact layer on the confinement layer wherein the contact layer is the top layer and the cladding layer is the underlying layer.

10. The method of claim 9 wherein having the separate confinement heterostructure includes having the separate confinement heterostructure that emits light at a wavelength of approximately 920 to 1200 nanometers.

11. The method of claim 9 wherein having the separate confinement heterostructure includes having a first gallium arsenide layer on the substrate, an indium gallium arsenide layer on the first gallium arsenide layer, and a second gallium arsenide layer on the indium gallium arsenide layer.

12. The method of claim 8 wherein forming the pattern layer on the top layer includes depositing a layer of titanium, followed by a layer of platinum followed by a layer of gold.

13. A method of forming a light emitting diode comprising:
   providing a III-V semiconductor substrate having a plurality of III-V semiconductor layers on the substrate;
   forming a pattern layer on the plurality of III-V semiconductor layers;
   forming a contact layer on the pattern layer;
   covering a portion of the contact layer with a mask wherein a portion of the contact layer is exposed adjacent the mask;
   removing the portion of the contact layer that is exposed by etching the contact layer with an etchant that does not etch the pattern layer so that a portion of the pattern layer is exposed adjacent the contact layer;
   removing the portion of the pattern layer that is exposed by etching the pattern layer with an etchant that does not etch the plurality of III-V semiconductor layers so that portions of the plurality of III-V semiconductor layers are exposed;
   removing the portions of the plurality of III-V semiconductor layers that are exposed until reaching a first distance into the plurality of III-V semiconductor layers by using an isotropic etch that etches the contact layer and the plurality of III-V semiconductor layers but does not etch the pattern layer thereby exposing an area for forming ohmic contacts on the plurality of III-V semiconductor layers; and
   using the pattern layer as a mask while depositing ohmic contact material onto the contact layer and onto the area for forming ohmic contacts.

14. The method of claim 13 wherein providing the III-V semiconductor substrate having the plurality of III-V semiconductor layers on the substrate includes having a cladding layer on the substrate, a seperate confinement heterostructure that forms an active layer on the cladding layer, and a confinement layer on the active layer.

* * * * *